(12) United States Patent
Duong et al.

(10) Patent No.: US 8,466,058 B2
(45) Date of Patent: Jun. 18, 2013

(54) PROCESS TO REMOVE NI AND PT RESIDUES FOR NIPTSI APPLICATIONS USING CHLORINE GAS

(75) Inventors: Anh Duong, Fremont, CA (US); John Foster, Mountain View, CA (US); Olov Karlsson, San Jose, CA (US); James Mavrinac, San Jose, CA (US); Usha Raghuram, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/295,333

(22) Filed: Nov. 14, 2011

(65) Prior Publication Data

US 2013/0122670 A1     May 16, 2013

(51) Int. Cl.
*H01L 21/44* (2006.01)
(52) U.S. Cl.
USPC ............ 438/655; 438/660; 438/682; 438/686
(58) Field of Classification Search
USPC .................................. 438/655, 660, 682, 686
See application file for complete search history.

(56) References Cited

U.S. PATENT DOCUMENTS

| | | | |
|---|---|---|---|
| 2005/0011537 A1* | 1/2005 | Toshima et al. | 134/19 |
| 2006/0027463 A1* | 2/2006 | Lavelle et al. | 205/556 |
| 2009/0127594 A1* | 5/2009 | Arunachalam et al. | 257/288 |
| 2010/0178764 A1* | 7/2010 | Narita et al. | 438/664 |
| 2010/0252888 A1* | 10/2010 | Iwamoto | 257/369 |

* cited by examiner

*Primary Examiner* — Jarrett Stark
*Assistant Examiner* — John M Parker (57) ABSTRACT

The invention discloses a method for cleaning residues from a semiconductor substrate during a nickel platinum silicidation process. Post silicidation residues of nickel and platinum may not be removed adequately just by an aqua regia solution (comprising a mixture of nitric acid and hydrochloric acid). Therefore, embodiments of the invention provide a multi-step residue cleaning, comprising exposing the substrate to an aqua regia solution, followed by an exposure to a chlorine gas or a solution comprising dissolved chlorine gas, which may further react with remaining platinum residues, rendering it more soluble in aqueous solution and thereby dissolving it from the surface of the substrate.

17 Claims, 8 Drawing Sheets

PROCESS TO REMOVE NI AND PT RESIDUES FOR NIPTSI APPLICATIONS USING CHLORINE GAS

RELATED APPLICATIONS

This application is related to U.S. application Ser. No. 13/094,967 filed on Apr. 27, 2011 and entitled "COMPOSITION AND METHOD TO REMOVE EXCESS MATERIAL DURING MANUFACTURING OF SEMICONDUCTOR DEVICES" and, to U.S. application Ser. No. 13/276,973 filed on Oct. 19, 2011 entitled "METHOD FOR CLEANING PLATINUM RESIDUES ON A SEMICONDUCTOR SUBSTRATE" and, to U.S. application Ser. No. 13/296,444 filed on Nov. 15, 2011 entitled "PROCESS TO REMOVE Ni AND Pt RESIDUES FOR NiPtSi APPLICATIONS", and to U.S. application Ser. No. 13/292,906 filed on Nov. 9, 2011 entitled "PROCESS TO REMOVE Ni AND Pt RESIDUES FOR NiPtSi APPLICATIONS USING AQUA REGIA WITH MICROWAVE ASSISTED HEATING" and, the disclosures of which are incorporated by reference herein.

FIELD OF THE INVENTION

The present invention relates to methods to form a silicide, and more particularly to methods to remove nickel and platinum residues.

BACKGROUND OF THE INVENTION

Silicide processes have been used to improve the conductivity of polysilicon gate and source/drain regions at the transistor level of an integrated circuit. The silicide layer provides a good ohmic contact at the interface of the gate and source/drain electrodes and the metal interconnects, reducing the contact resistance of the electrodes. The silicide materials have been changed from titanium silicide at above 130 nm device dimensions, to cobalt silicide at between 90 nm to 130 nm device dimensions, to nickel silicide at between 65 nm to 90 nm device dimensions, and now to nickel platinum silicide for device dimensions below 65 nm.

Advanced semiconductor fabrication processes currently use nickel and nickel alloy silicide due to their low electrical resistivity, low silicon consumption, good resistance behavior in narrow lines, and low processing temperature. A conventional method of forming a nickel silicide includes depositing a nickel layer on a semiconductor wafer, followed by a first rapid thermal process (RTP) at low temperatures of about 300 C to react nickel with silicon to produce high resistance nickel silicide phase $Ni_2Si$ or NiSi. A selective etching process is performed to remove the unreacted nickel layer, and a second RTP at higher temperatures of about 450 C is performed to convert high resistance nickel silicide phase $Ni_2Si$ or NiSi to low resistance nickel silicide phase $NiSi_2$.

A challenge of nickel silicide is the potential spiking effect, together with possible lateral diffusion to the channel region. Thus nickel alloy silicide, especially nickel platinum silicide, has been used to improve the thermal stability of nickel silicide. For example, nickel platinum silicide with 5 to 10 atomic percent (at %) platinum content can increase the silicide nucleation temperature to 900 C and the agglomeration temperature to 750 C, while still retaining the same conductivity as that of pure nickel silicide. However, platinum is difficult to etch, resulting in potential platinum residue issues during the removal of the unreacted metal layer.

Traditionally, aggressive chlorine-based chemistries that use concentrated hydrochloric acid (HCl) and an oxidant such as hydrogen peroxide ($H_2O_2$) or nitric acid ($HNO_3$) have been used to etch platinum in unreacted nickel platinum metal layer. Platinum metal can be oxidized by the oxidant to form platinum ions, which are then reacted with chloride ions to form soluble hexachloroplatinic acid.

Aqua regia (etching solution comprising $HNO_3$+HCl) is known to degrade nickel platinum silicide quality, especially for two step thermal processes. For example, mixed phases of nickel platinum silicide can be formed at various RTP temperatures, with lower RTP temperatures resulting in a higher proportion of metal-rich silicide phases, which are less susceptible to attack by aqua regia.

Alternative chemistries for etching platinum in nickel platinum silicide formation include sulfuric acid solutions, such as sulfuric peroxide mixture (SPM). However, though nickel metal can be successfully removed by dilute sulfuric peroxide mixtures, some portions of nickel platinum alloys may still remain, leaving behind stringers.

Therefore, what is needed are etch solutions and methods that allow for the safe removal of advanced materials (e.g., nickel and platinum) during semiconductor processing and manufacturing.

SUMMARY OF THE DESCRIPTION

In some embodiments, the present invention discloses a cleaning process to remove nickel and platinum residues using chlorine-containing gas either in gaseous form or dissolved in a fluid. The chlorine-containing gas can convert platinum to a more soluble state which can facilitate the residue removal.

In some embodiments, the present invention discloses a cleaning process using a sequential application of dilute aqua regia and a chlorine solution containing dissolved chlorine-containing gas. The dilute aqua regia can remove nickel and convert platinum to a soluble platinum state. The chlorine solution can remove nickel, platinum and nickel/platinum residues that still remain after the aqua regia cleaning process. For example, chlorine in the chlorine solution can further oxidize the soluble chloroplatinous acid ($H_2PtCl_4$) to chloroplatinic acid ($H_2PtCl_6$), which is one of the most soluble platinum forms of $Pe^+$.

In some embodiments, the present invention discloses methods to form nickel platinum silicide, comprising depositing a layer of nickel platinum on a silicon substrate, or a substrate comprising at least a silicon or germanium region. After performing a first rapid thermal process to react nickel and platinum with silicon to form nickel platinum silicide, the substrate is exposed to a first solution of dilute nitric acid. The dilute nitric acid can remove the unreacted nickel and platinum. After performing a second rapid thermal process to convert nickel platinum silicide to low resistant nickel platinum silicide phase, the substrate is exposed to a second solution of dilute aqua regia to further remove the remaining nickel and platinum. The substrate is then exposed to a chlorine solution comprising dissolved chlorine-containing gas to further remove the remaining platinum residues.

In some embodiments, the present invention discloses methods to form a semiconductor device, comprising forming a transistor structure on a semiconductor substrate and forming a nickel platinum silicide on at least a gate electrode or a source/drain region of the transistor structure.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, the present invention discloses a process to remove nickel and platinum residues on a semiconductor surface using gaseous chlorine, either in gaseous ambient or in liquid ambient having chlorine-containing gas dissolved therein. In the following description, the term "chlorine gas" is used to describe the invention, but the invention is not limited to pure chlorine gas, and "chlorine gas" used in this specification generally means "chlorine-containing gas".

Generally, platinum solid can be dissolved, by reacting with nitric acid to form platinum ions $Pt^{4+}$,

$$3Pt(s)+4NO_3^-(aq)+16H^+(aq) \rightarrow 3Pt^{4+}(aq)+4NO(g)+8H_2O(l)$$

The oxidized platinum ions then react with chlorine ions $Cl^-$ to form soluble chloroplatinate ions $PtCl_6^{2-}$, which is one of the most soluble forms of platinum ions:

However, the reaction of platinum with aqua regia is considerably more complex, since chlorine ions can react with platinum ions to form different chloro-platinum compounds with different degrees of solubility. For example, platinum reacting with aqua regia can additionally produce the less soluble chloroplatinous acid $H_2PtCl_4$:

Thus cleaning platinum residues with aqua regia might be incomplete, leaving platinum residues on the semiconductor surface.

In some embodiments, the present invention discloses further exposing the surface to gaseous chlorine to provide full dissolution of platinum, converting the less soluble chloroplatinous acid $H_2PtCl_4$ to the more soluble hexachloroplatinic acid $H_2PtCl_6$:

The gaseous chlorine can be introduced to the semiconductor surface in a gaseous ambient or preferably in a liquid ambient containing dissolved chlorine gas.

In some embodiments, chlorine gas is bubbled through a fluid to form a solution in which the semiconductor surface is exposed for cleaning nickel and platinum residues. The fluid can comprise water, acid, or an organic solvent. In some embodiments, the solution, or the chlorine gas, is heated to a temperature less than about 80 C, and preferably between about 40 and about 60 C.

In some embodiments, the present invention discloses a process to remove nickel and platinum residues from a surface of a substrate by exposing the surface to a chlorine solution, wherein the chlorine solution comprises a chlorine gas dissolved in a liquid. In some embodiments, the semiconductor surface can be first exposed to aqua regia, e.g., a solution comprising a mixture of nitric acid and hydrochloric acid. The aqua regia can remove nickel and platinum residues from the surface, any remaining residues can be removed by the chlorine solution. In some embodiments, the semiconductor surface can also be exposed to a dilute nitric acid solution, a sulfuric acid solution, or a sulfuric peroxide solution (comprising a mixture of sulfuric acid and hydrogen peroxide) to remove nickel and some portion of platinum. In some embodiments, the semiconductor surface can be exposed to a sequence of a sulfuric peroxide solution followed by an aqua regia solution; or a dilute nitric acid followed by an aqua regia solution before being exposed to a chlorine solution.

In some embodiments, the present invention discloses a process to remove nickel and platinum residues using dilute aqua regia solution and chlorine solution. In some embodiments, the aqua regia solution and the chlorine solution are applied in sequence after thermal processing, where the aqua regia etches nickel and platinum, and the chlorine solution further dissolves remaining platinum.

In some embodiments, the present invention discloses a nickel and platinum cleaning process using a two step cleaning process where the first cleaning step etches platinum, and the second cleaning step cleans any remaining platinum not etched by the first cleaning step. For example, the first cleaning step can be performed after a rapid thermal process, reacting nickel and platinum with silicon to form nickel platinum silicide. In addition the first cleaning steps can be tailored to convert the platinum to a more soluble state which can facilitate the second cleaning step.

In some embodiments, the first cleaning step comprises an aqua regia solution to etch nickel. Aqua regia also comprises nitric acid, which is an oxidant acid, and thus can partially oxidize platinum, for example, to platinum $Pt^{4+}$, which has high solubility in hydrochloric acid. The remaining platinum that has not been dissolved in aqua regia is then subjected to the second cleaning step of a chlorine solution, dissolving the remaining platinum oxide.

In some embodiments, the present invention discloses a process to remove nickel and platinum residues using dilute nitric acid, dilute aqua regia and chlorine solution. In some embodiments, the dilute nitric acid, dilute aqua regia, and chlorine solution are applied in sequence after thermal processing, where the dilute nitric acid mainly etches nickel, the aqua regia mainly dissolves platinum, and the chlorine solution further dissolves remaining platinum.

In some embodiments, the separation of etching materials, e.g., nickel etching in a first dilute nitric acid and platinum etching in a second aqua regia solution, can be effective in removing nickel and platinum residue while preventing damage to the substrate. For example, platinum is unreactive, and generally needs to be oxidized to platinum ions, which then can be dissolved in chlorine-based chemistries, such as aqua regia solution to form soluble hexachloroplatinic acid $H_2PtCl_6$. However, platinum can be oxidized to various oxidation states, such as $Pt^+$, $Pt^{3+}$, or $Pt^+$, each with different solubility in chlorine-based chemistries. For example, the $Pt^+$ and $Pt^{3+}$ oxidation states are harder to dissolve than the $Pt^{4+}$ oxidation state, and thus directly dissolving multiple oxidation states of platinum ions in aqua regia might require high concentration of hydrochloric acid, such as a typical aqua regia solution of about 30 wt % hydrochloric acid and about 14 wt % nitric acid. The high concentration aqua regia, though effective in dissolving platinum, can also cause damage to the device. Alternatively, platinum can be dissolved in strong oxidant chemistries, such as a sulfuric peroxide mixture, but the strong oxidant etching of platinum tends to be incomplete, leaving platinum residues. In the present specification, the terms "platinum etch", "platinum removal", or "platinum dissolving" have similar meaning, which is to remove solid platinum from the surface of the substrate. Further, the present specification discloses chlorine gas, but the invention is not so limited, and any chlorine-containing gas can be used.

In some embodiments, the present invention discloses a nickel and platinum cleaning process using a three step cleaning process where the first cleaning step mainly etches nickel, the second cleaning step mainly etches platinum, and the third cleaning step cleans any remaining platinum. For example, the first and second cleaning steps can be performed after a rapid thermal process, reacting nickel and platinum with silicon to form nickel platinum silicide. In addition the first and second cleaning steps can be tailored to convert the platinum to a more soluble state which can facilitate the third cleaning step.

In some embodiments, the first cleaning step comprises an acid, such as dilute nitric acid, to etch nickel. Nitric acid is also an oxidant acid, and thus can partially oxidize platinum, for example, to platinum $Pt^{4+}$, which has high solubility in hydrochloric acid. The high solubility platinum oxide is then subjected to the second cleaning step of an aqua regia solution, dissolving the platinum. With some platinum already converted to $Pt^{4+}$ by the nitric acid in the first step, the aqua regia solution can be more dilute and still effective at removing platinum. In some embodiments, the dilute aqua regia can be more dilute than conventional aqua regia solution, for example, up to 2× more dilute in nitric acid and hydrochloric acid.

In some embodiments, the present invention discloses a method for cleaning residues from a surface of a substrate, comprising exposing the surface, after a rapid thermal process, to a first solution comprising a mixture of nitric acid and hydrochloric acid. Subsequently, the surface is exposed to a second solution containing dissolved chlorine gas.

In some embodiments, the present invention discloses a method for cleaning residues from a surface of a substrate, comprising exposing the surface, after a first rapid thermal process, to a first solution comprising dilute nitric acid, wherein the first solution does not comprise a chlorine-based acid. Subsequently, the surface is exposed, after a second rapid thermal process, to a second solution containing a mixture of nitric acid and hydrochloric acid. Afterward, the surface is exposed to a third solution containing dissolved chlorine gas.

In some embodiments, chlorine gas is bubbled through a fluid to form the second solution. The fluid can comprise water, acid, or an organic solvent. In some embodiments, the solution, or the chlorine gas, is heated to a temperature less than about 80 C, and preferably between about 40 and about 60 C.

In some embodiments, the concentration of the dilute nitric acid in the first cleaning solution is less than about 20 wt %, and preferably less than about 10 wt %. The concentration of dilute nitric acid is also preferably higher than about 2 or about 3 wt %. In some embodiments, the concentration of the nitric acid in dilute aqua regia is less than about 15 wt % and preferably less than about 10 wt % and the concentration of the hydrochloric acid in dilute aqua regia is less than about 20 wt % and preferably less than about 16 wt %. For example, the dilute aqua regia can comprise less than about 10 wt % nitric acid with less than about 20 wt % hydrochloric acid. Alternatively, the dilute aqua regia can comprise less than about 15 wt % nitric acid with less than about 16 wt % hydrochloric acid.

In some embodiments, the cleaning process is performed for less than about 10 minutes, and preferably about 5 minutes or less. The temperature of the solution, e.g., the dilute nitric acid, the dilute aqua regia, or the chlorine solution, can be less than about 8° C. or less than about 6° C. In some embodiments, a water rinse is performed after the cleaning steps. For example, the surface is rinsed with water after being exposed to dilute nitric acid, after being exposed to dilute aqua regia solution, or after being exposed to chlorine solution.

In some embodiments, the cleaning solution of dilute nitric acid in the first cleaning step does not comprise chlorine-based acid, and can further comprise a non-chlorine chemical, such as a solvent, an acid comprising fluorine (e.g., HF), or an organic acid (e.g., acetic acid or carbonyl acid).

In some embodiments, the present invention discloses methods to form nickel platinum silicide, using the present two step cleaning process to remove nickel and platinum residues. The first cleaning step mainly etches nickel and platinum, comprising a first solution comprising an aqua regia solution, with the nitric acid component in the aqua regia solution oxidizing the platinum residues and the hydrochloric acid element in the aqua regia solution reacting with the oxidized platinum to form various forms of soluble chloro-platinum acid.

In some embodiments, the present invention discloses methods to form a nickel platinum silicide, comprising providing a substrate having at least one silicon-containing region. For example, the silicon-containing region can be a polysilicon gate electrode, or a silicon germanium source or drain region. A layer comprising nickel and platinum is then formed on the substrate, for example, by a physical vapor deposition process. A thermal process, preferably a rapid thermal process, is performed on the substrate comprising the nickel platinum layer, reacting the nickel and platinum with the silicon in the substrate to form nickel platinum silicide. The substrate is then exposed to a first cleaning solution comprising aqua regia comprising dilute nitric acid and hydrochloric acid, for example, to remove nickel and platinum residues from the nickel platinum layer. Afterward, the substrate is exposed to a chlorine solution, cleaning any remaining residues of platinum.

In some embodiments, the present methods comprise other limitations as described above such as the formation of chlorine solution, the temperature, the concentration, the cleaning time and the rinsing process.

In some embodiments, the rapid thermal process is performed at temperature between about 30° C. to about 45° C. for less than about 1 minute in nitrogen ambient.

In some embodiments, the present invention discloses methods to form nickel platinum silicide, using the present three step cleaning process to remove nickel and platinum residues. The first cleaning step mainly etches nickel, comprising a first solution comprising nitric acid without any chlorine-based acid (e.g., without hydrochloric acid). For example, the first solution can be dilute nitric acid. Alternatively, the first solution can be a mixture of nitric acid with a non-chlorine-based acid or non-chlorine-based chemical, such as a solvent, an acid comprising fluoride (e.g., HF), or an organic acid (e.g., acetic acid or carbonyl acid). The dilute nitric acid solution can also oxidize a portion of the platinum residues, rendering them easier to dissolve in the second cleaning solution. The process conditions of the first cleaning step can be optimized to facilitate the subsequent platinum removal process, for example, to oxidize platinum to $Pt^{4+}$, which can be easily reacted with chlorine-based chemistries to form soluble platinum compounds, instead of to $Pt^+$ or $Pt^{3+}$, which can be harder to remove in the second cleaning step using dilute aqua regia. Further, the dilute nitric acid solution can be tailored to prevent damage to the substrate, for example, by employing cleaning solutions that are not designed to aggressively remove platinum.

The second cleaning step mainly removes platinum. For example, the second solution in the second step can comprise an aqua regia solution, with the nitric acid component in the aqua regia solution oxidizing the platinum residues and the hydrochloric acid element in the aqua regia solution reacting with the platinum to form soluble hexachloroplatinic acid. Further, the second cleaning step can be assisted by the oxidizing action of platinum in the first cleaning step through the dilute nitric acid. Therefore, the aqua regia solution can be made more dilute, for example, as compared to typical prior art aqua regia platinum etching of 14 wt % nitric acid and 30 wt % hydrochloric acid.

The third cleaning step mainly removes the remaining platinum after the first two cleaning steps. For example, the third solution in the third cleaning step can comprise a chlorine solution, which is a solution containing dissolved chlorine gas, to convert the less soluble chloroplatinous acid to the more soluble chloroplatinic acid.

In some embodiments, the present invention discloses methods to form a nickel platinum silicide, comprising providing a substrate having at least one silicon-containing region. For example, the silicon-containing region can be a polysilicon gate electrode, or a silicon germanium source or drain region. A layer comprising nickel and platinum is then formed on the substrate, for example, by a physical vapor deposition process. A first thermal process, preferably a rapid thermal process, is performed on the substrate comprising the nickel platinum layer, reacting the nickel and platinum with the silicon in the substrate to form various phases of nickel platinum silicide. The substrate is then exposed to a first cleaning solution comprising dilute nitric acid, for example, to remove unreacted nickel (and/or platinum) from the nickel platinum layer. As disclosed above, the dilute nitric acid solution mainly removes nickel and partially oxidizes platinum. In some embodiments, some platinum can be dissolved or removed. A second thermal process, also preferably a rapid thermal process, is performed on the substrate comprising the nickel platinum silicide, to further react the various phases of nickel platinum silicide with silicon in the substrate to form low resistive nickel platinum silicide. The substrate is then exposed to a second cleaning solution comprising aqua regia comprising dilute nitric acid and hydrochloric acid, for example, to remove platinum residues from the remaining nickel platinum layer. For example, the nitric acid can oxidize platinum, and the hydrochloric acid can dissolve the oxidized platinum. As disclosed above, the present aqua regia solution can be more dilute, but still effective, than typical aqua regia used in cleaning nickel platinum residues, perhaps due to the prior oxidation of platinum to $Pt^{4+}$ by the first cleaning step using dilute nitric acid. Afterward, the substrate is exposed to a chlorine solution, cleaning any remaining residues of platinum.

In some embodiments, the present methods comprise other limitations as described above such as the formation of chlorine solution, the temperature, the concentration, the cleaning time and the rinsing process.

In some embodiments, the first rapid thermal process is performed at temperature below about 380 C, for example, at about 300 C for less than 1 minute in nitrogen ambient. In some embodiments, the second rapid thermal process is performed at temperature above about 300 C, for example, at about 450 C for less than 1 minute in nitrogen ambient.

In some embodiments, the cleaning solution of dilute nitric acid in the first cleaning step does not comprise chlorine-based acid, and can further comprise a non-chlorine chemical, such as a solvent, an acid comprising fluorine (e.g., HF), or an organic acid (e.g., acetic acid or carbonyl acid).

In some embodiments, the present invention discloses methods to form a semiconductor device, comprising forming at least a nickel platinum silicide contact for a transistor structure. The transistor structure can comprise a gate electrode and a source/drain region over a semiconductor substrate. The gate electrode can comprise an exposed doped polysilicon layer. The source/drain region can comprise an exposed silicon or a silicon germanium area. A layer comprising nickel and platinum is then formed on the substrate, for example, by a physical vapor deposition process. The nickel platinum layer can be deposited on the exposed portions of the gate electrode and source/drain region, covering the gate electrode or the source/drain region.

An optional first rapid thermal process is performed on the substrate, reacting the nickel and platinum with the silicon in the gate electrode or the source/drain region to form various phases of nickel platinum silicide, such as nickel rich silicide. The substrate is then optionally exposed to a first cleaning solution comprising dilute nitric acid, for example, to remove unreacted nickel (and/or platinum) from the nickel platinum layer. A second thermal process, also preferably a rapid thermal process, is performed on the substrate comprising the nickel platinum silicide, to further react the various phases of nickel platinum silicide with silicon in the substrate to form low resistive nickel platinum silicide. The substrate is then exposed to a second cleaning solution comprising aqua regia comprising dilute nitric acid and hydrochloric acid, for example, to remove platinum residues (including Pt or NiPt residues) from the remaining nickel platinum layer. Afterward, the substrate is exposed to a chlorine solution, cleaning any remaining residues of platinum.

In some embodiments, the present methods comprise other limitations as described above such as the formation of chlorine solution, the temperature, the concentration, the cleaning time, the rinsing process, and the rapid thermal process conditions.

In some embodiments, the cleaning solution of dilute nitric acid in the first cleaning step does not comprise chlorine-based acid, and can further comprise a non-chlorine chemical, such as a solvent, an acid comprising fluorine (e.g., HF), or an organic acid (e.g., acetic acid or carbonyl acid).

In some embodiments, the post silicidation clean process is selective towards other exposed materials such as $Si_3N_4$ (spacers), $SiO_2$ (field oxide), NiPtSi (contact electrodes), and NiPtSiGe (contact electrodes of source/drain for strain applications).

Figure 1A:
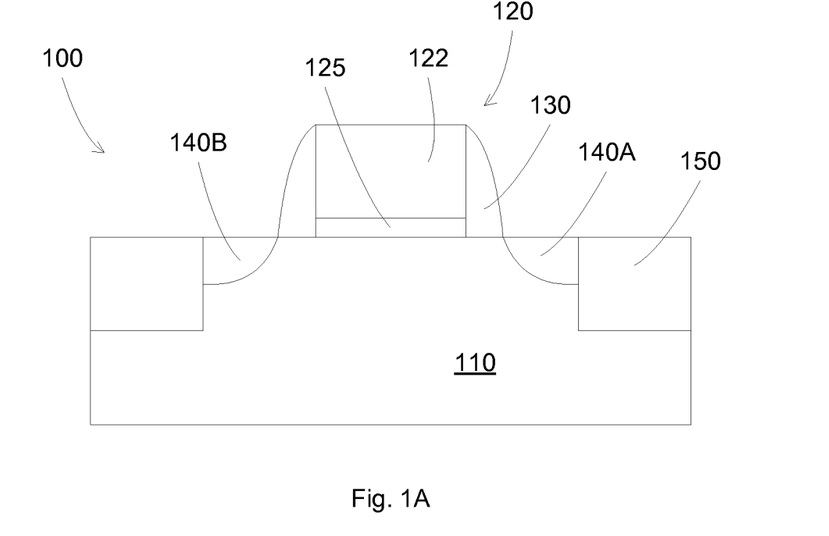
FIGS. 1A-1E illustrate an exemplary process flow for forming a semiconductor device according to some embodiments of the present invention.

FIGS. 1A-1E illustrate an exemplary process flow for forming a semiconductor device according to some embodiments of the present invention. In FIG. 1A, a transistor structure 100 is formed on a substrate 110, comprising isolation regions 150 to isolate the neighboring devices, source and drain regions 140A and 140B sandwiching a gate electrode 120 comprising a gate dielectric 125 and a gate conductor 122. Spacers 130 cover the sidewalls of the gate electrode 120. The substrate 110 can be a semiconductor substrate, or any substrates having a layer of semiconductor material. For example, the substrate can be a single crystal silicon substrate. The substrate can be a silicon-germanium substrate, or can have a silicon germanium layer disposed on top. The gate conductor can comprise doped polysilicon. The top surfaces of the gate electrode 120 and the source and drain regions 140A and 140B are preferably exposed. FIG. 1A shows an exemplary metal-oxide-semiconductor field effect transistor (MOSFET) structure 100, but the invention is not so limited, and can include any transistor structure, such as bipolar transistors, fin transistors or double gate transistors. In addition, the present process flow describes a silicidation process for gate electrode 120 and on source and drain regions 140A and 140B, but the invention is not so limited, and can include silicidation for any combination, for example, for only for the gate electrode 120, or only for the source or drain regions 140A or 140B.

Figure 1B:
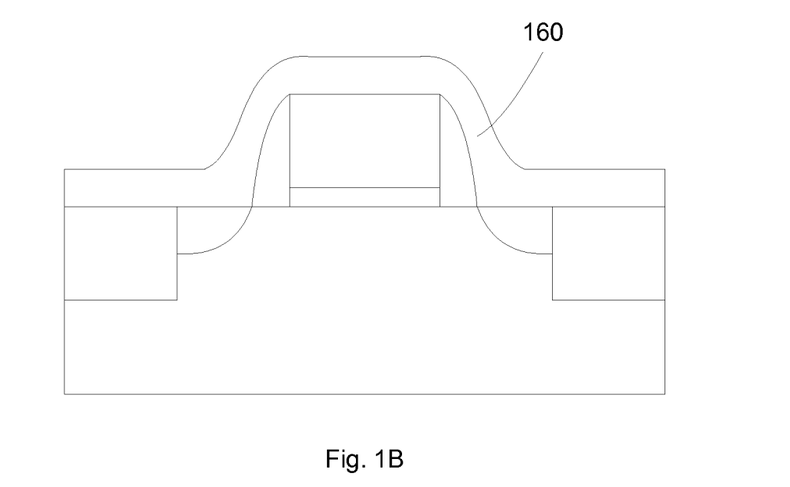

In FIG. 1B, a layer 160 comprising nickel and platinum is formed on the transistor structure, covering the exposed surfaces of the gate electrode and the source and drain regions. The nickel platinum layer 160 is preferably deposited using PVD process. The platinum concentration can be between about 5 wt % and about 15 wt %, and preferably at about 10 wt %. Additional surface preparation can be performed, such as a preclean step with dilute hydrofluoric acid and/or a native oxide removal step for the exposed gate electrode and source/drain regions.

Figure 1C:
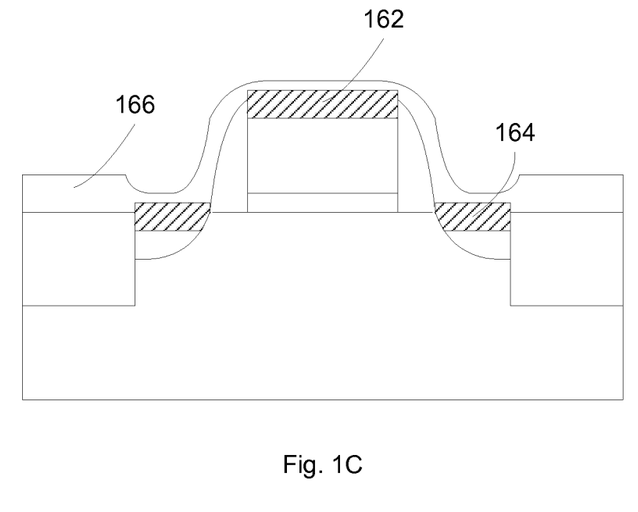

In FIG. 1C, the substrate, together with the transistor structure 100 and the nickel platinum layer 160 is annealed, for example, by a first rapid thermal process, to react nickel and platinum in the nickel platinum layer 160 with the silicon in the gate electrode 120 and source/drain regions 140A/140B. A nickel platinum silicide layer 162 is formed at the top surface of the gate electrode 120, and nickel platinum silicide layers 164 are formed at the top surface of the source/drain regions. Unreacted nickel platinum layer 166 remains in areas protected by the spacers and the isolation regions 150, and can comprise excess nickel platinum after the rapid thermal reaction. The first rapid thermal process can comprise an anneal in nitrogen ambient, at temperature lower than about 380 C for less than a minute. For example, a preferred rapid thermal process comprises annealing at about 300 C for about 30 seconds. The first rapid thermal process can react nickel and platinum with silicon to form various phases of nickel platinum silicide, for example, high resistive phases of mono-nickel platinum silicide or di-nickel platinum silicide.

Figure 1D:
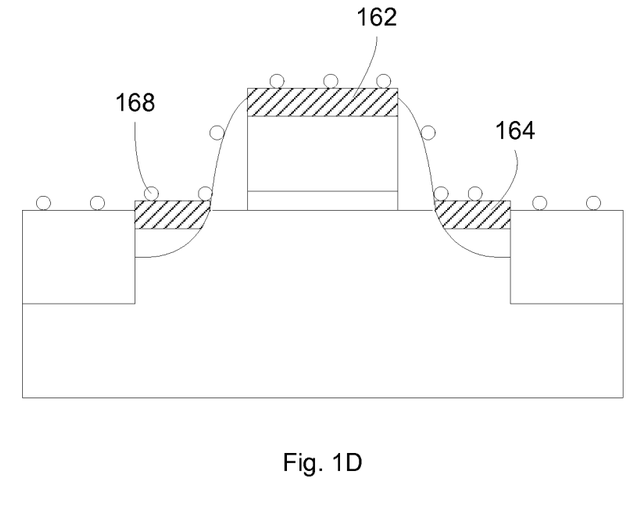

In FIG. 1D, the substrate surface, comprising unreacted nickel platinum layer 166, together with nickel platinum silicide layers 162, 164 at the gate electrode and the source/drain regions, are exposed to a first cleaning solution comprising dilute nitric acid. In some embodiments, the first cleaning solution comprises only dilute nitric acid, i.e., nitric acid diluted in water. In some embodiments, the first cleaning solution comprises dilute nitric acid and a non-chlorine based acid. The exclusion of chlorine based acid such as hydrochloric acid can serve to reduce potential damage caused by chlorine based acid after the first rapid thermal process. For example, the first solution can comprise a solvent, an acid containing fluorine, or an organic acid (e.g., an acid containing carbon).

In some embodiments, the concentration of the dilute nitric acid in the first cleaning solution is less than about 15 wt %, and preferably less than about 10 wt % or about 7 wt %. In some embodiments, the dilute nitric acid concentration can be greater than about 3 wt %. The low concentration of nitric acid can effectively remove unreacted nickel, without damaging the transistor device, such as without damaging the underlying substrates comprising TiN, SiN, and $SiO_2$.

In some embodiments, the first cleaning step is performed for about 5 minutes at temperature about 40 C, followed by a water rinse at 25 C (e.g., room temperature) for about 2 minutes. After the first cleaning with dilute nitric acid solution, some of the nickel is removed and some platinum is oxidized, leaving some remaining residues 168 of nickel, platinum, oxidized platinum, and nickel platinum compounds. In some embodiments, the first rapid thermal process and/or the first cleaning are optional.

Figure 1E:
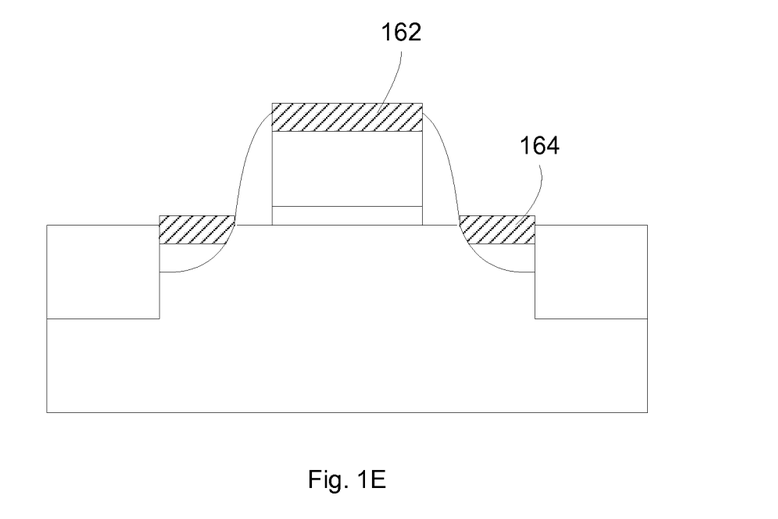

In FIG. 1E, the substrate is annealed, for example, by a second rapid thermal process, to further reduce the resistance of the nickel platinum silicide. For example, the high resistive phases of mono-nickel platinum silicide or di-nickel platinum silicide can further react with silicon to form a low resistive phase of nickel platinum di-silicide. The second rapid thermal process can comprise an anneal in nitrogen ambient, at temperature higher than about 300 C for less than a minute. For example, a preferred rapid thermal process comprises annealing at about 450 C for about 30 seconds.

After the second rapid thermal process, the substrate is treated with a second cleaning solution comprising dilute aqua regia. The dilute aqua regia can remove remaining nickel, oxidize remaining platinum, dissolve oxidized platinum, and in general, clean the surface of residues of nickel, platinum and nickel platinum compounds. As discussed above, the aqua regia is preferably diluted, for example, up to 2× more dilute than prior art aqua regia solution for cleaning nickel platinum residues. The present diluted aqua regia solution can reduce damage to the transistor devices, and can still be effective in removing nickel platinum residues.

In some embodiments, the dilute aqua regia comprises about 7 wt % nitric acid and about 20 wt % hydrochloric acid. In some embodiments, the dilute aqua regia comprises about 14 wt % nitric acid and about 15 wt % hydrochloric acid. In some embodiments, the aqua regia cleaning is performed for about 5 minutes at temperature about 40 C, followed by a water rinse at 25 C (e.g., room temperature) for about 2 minutes.

In some embodiments, the substrate is treated with a third cleaning solution to further remove any remaining nickel and platinum residues, such as a cleaning solution comprising active chlorine can be used in the third cleaning step. For example, solution comprising dissolved chlorine gas can be applied on the surface for less than about 30 minutes, preferably less than about 5 minutes, at temperature less than about 80 C, preferably at about 20 C to about 60 C. In some embodiments, chlorine gas is bubbled through a fluid to form the chlorine solution. The fluid can comprise water, acid, or an organic solvent. In some embodiments, the solution, or the chlorine gas, is heated to a temperature less than about 80 C, and preferably between about 40 and about 60 C.

Alternatively, the third cleaning solution can comprise a hydrochloric acid solution at about 3 to about 10 wt %, which can be applied on the semiconductor surface for another about 3 to about 5 minutes at about 40 C to about 80 C.

In some embodiments, the present multiple step cleaning using dilute nitric acid, dilute aqua regia, and chlorine solution can effectively remove nickel, platinum and nickel/platinum residues without damage to the transistor device, such as forming shallow craters devoid of silicide in the Ni(Pt)Si film. Further, the present cleaning process does not attack the different device materials, such as TiN, SiN spacers and $SiO_2$. The present cleaning solutions further have additional advantages of prolonged shelf life, for example, up to several months, due to the dilute concentration of nitric acid and aqua regia. Dilute nitric acid can be easier to use than concentrated nitric acid, and compared to prior art solutions, such as SPM. In general, dilute nitric acid does not attack platinum, e.g., the portion of platinum oxidation states, e.g., $Pt^+$ or $Pt^{3+}$, that are difficult to dissolve in hydrochloric acid can be much smaller than the portion of platinum oxidation state, e.g., $Pt^{4+}$, that are more soluble in hydrochloric acid.

In some embodiments, the present cleaning solutions can improve nickel and platinum residue removal, especially at high concentrations of platinum (e.g., >5 wt % platinum in nickel platinum layer).

Figure 2:
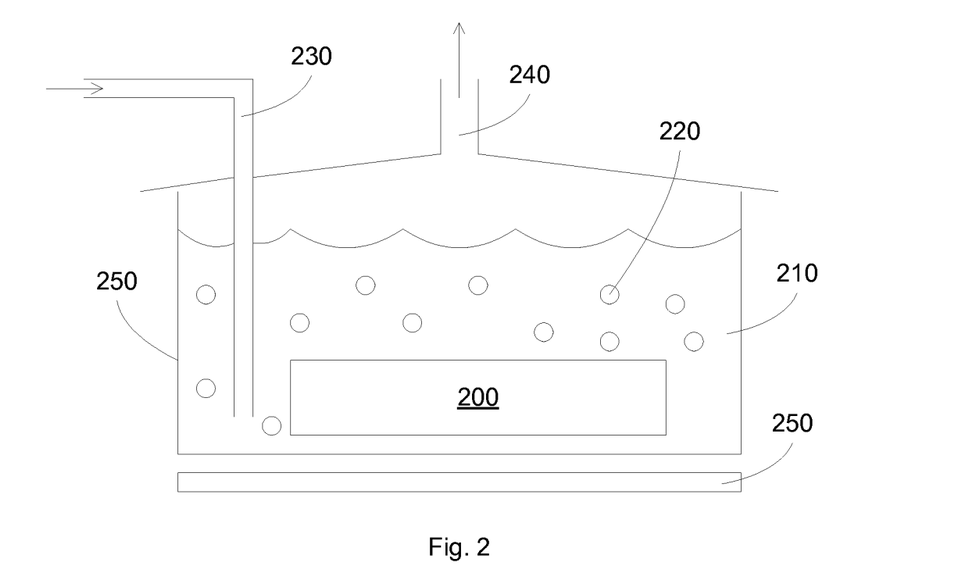
FIG. 2 illustrates an exemplary cleaning apparatus employing solution comprising dissolved chlorine gas according to some embodiments of the present invention.

FIG. 2 illustrates an exemplary cleaning apparatus employing solution comprising dissolved chlorine gas according to some embodiments of the present invention. A container 250 contains a liquid 210, such as water. A lid having an exhaust port 240 is disposed on the container 250 to capture any released gas. A substrate 200 is submerged in the liquid 210. Chlorine gas is introduced to the liquid 210 by bubbling through a tube 230, generating chlorine bubbles 220. Dissolved chlorine gas can react with platinum compounds (such as chloroplatinous acid) to form more soluble platinum compounds (such as chloroplatinic acid). Alternatively, dissolved chlorine gas can form equilibrium reaction with water in the liquid 210:

Chlorine gas can be provided to the container 250 in the form of compressed gas. Alternatively, chlorine gas can be generated on demand from solid sources such as $Ca(OCl)_2$, MnO2, or NaOCl.

Figure 3:
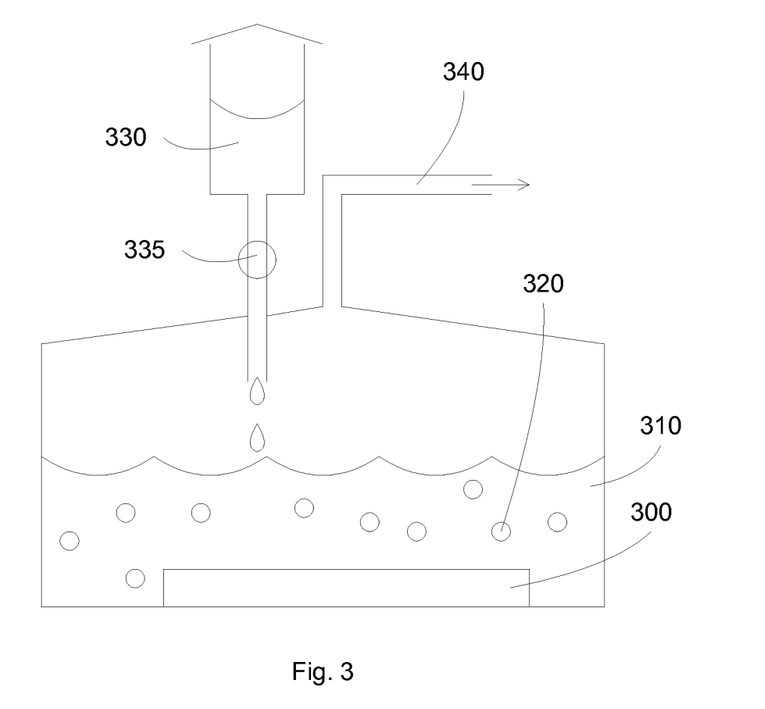
FIG. 3 illustrates an exemplary on demand chlorine gas generating apparatus according to some embodiments of the present invention.

FIG. 3 illustrates an exemplary on demand chlorine gas generating apparatus according to some embodiments of the present invention. Hydrochloric acid or ammonia ($NH_3$) 330 is slowly added, for example, by regulating valve 335, to a solution 310 containing $Ca(OCl)_2$, MnO2, or NaOCl, 300. Upon mixing, chlorine gas 320 will be generated, and collected by exhaust line 340. The reaction is typically exothermic, and the rate of adding hydrochloric acid or ammonia is controlled to prevent overheating.

Figure 4:
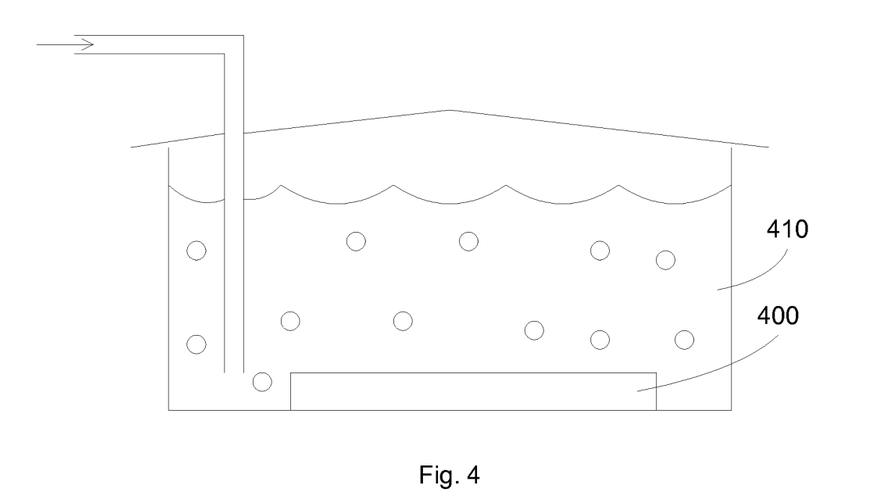
FIG. 4 illustrates an exemplary chlorine gas disposal apparatus according to some embodiments of the present invention.

In some embodiments, the present invention discloses methods to collect and dispose of chlorine gas, for example, in the cleaning solution. Ascorbic acid ($C_5H_5O_5CH_2OH$) or sodium hydrogen sulfite ($NaHSO_3$) can be used to react with chlorine gas or chlorine by-products in the cleaning solution to form disposable compounds FIG. 4 illustrates an exemplary chlorine gas disposal apparatus according to some embodiments of the present invention. Solid ascorbic acid or sodium hydrogen sulfite 400 is introduced to the solution containing chlorine gas 410 to react and convert chlorine and chlorine products (e.g., HOCl).

Figure 5:
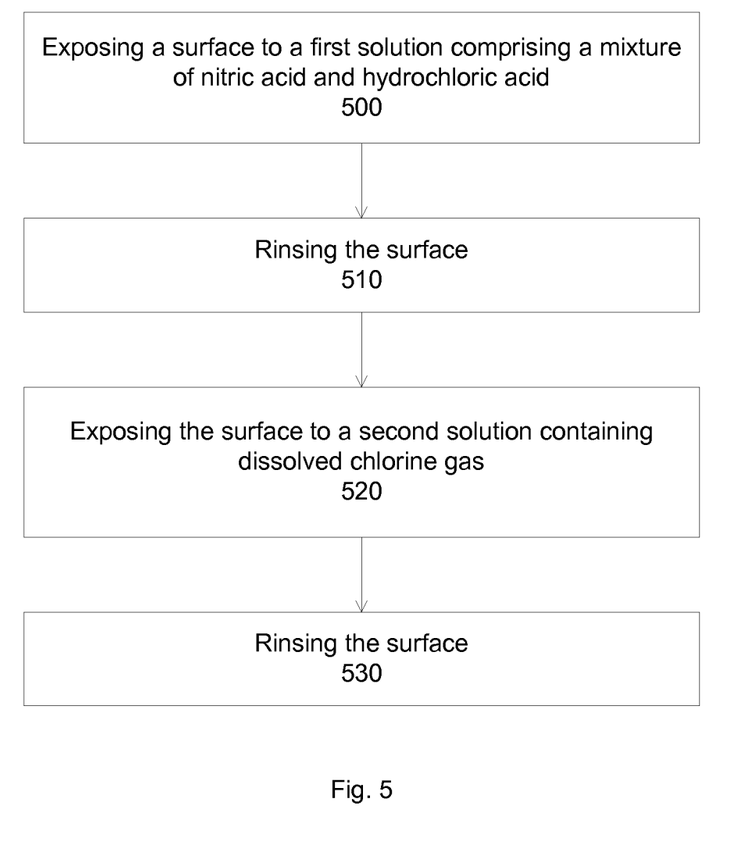
FIG. 5 illustrates an exemplary process flowchart for cleaning a surface according to some embodiments of the present invention.

FIG. 5 illustrates an exemplary process flowchart for cleaning a surface according to some embodiments of the present invention. Operation 500 exposes a surface to a first solution comprising a mixture of nitric acid and hydrochloric acid. Operation 510 rinses the surface. Operation 520 exposes the surface to a second solution containing dissolved chlorine gas. Operation 530 rinses the surface.

Figure 6:
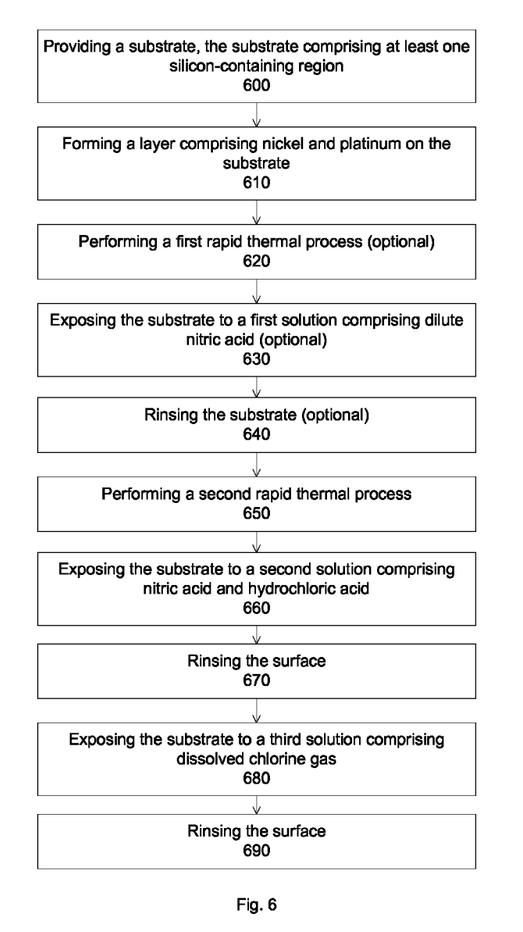
FIG. 6 illustrates an exemplary process flowchart for forming a nickel platinum silicide according to some embodiments of the present invention.

FIG. 6 illustrates an exemplary process flowchart for forming a nickel platinum silicide according to some embodiments of the present invention. Operation 600 provides a substrate, the substrate comprising at least one silicon-containing region. Operation 610 forms a layer comprising nickel and platinum on the substrate. Operation 620 optionally performs a first rapid thermal process. Operation 630 optionally exposes the substrate to a first solution comprising dilute nitric acid. Operation 640 optionally rinses the substrate. Operation 650 performs a second rapid thermal process. Operation 660 exposes the substrate to a second solution comprising nitric acid and hydrochloric acid. Operation 670 rinses the surface. Operation 680 exposes the substrate to a third solution comprising dissolved chlorine gas. Operation 690 rinses the surface.

Figure 7:
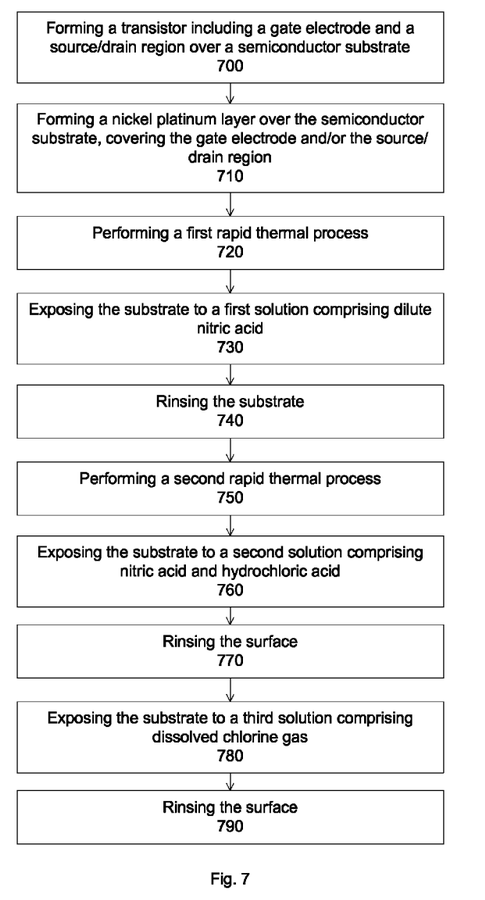
FIG. 7 illustrates an exemplary process flowchart for forming a semiconductor device according to some embodiments of the present invention.

FIG. 7 illustrates an exemplary process flowchart for forming a semiconductor device according to some embodiments of the present invention. Operation 700 forms a transistor including a gate electrode and a source/drain region over a semiconductor substrate. Operation 710 forms a nickel platinum layer over the semiconductor substrate, covering the gate electrode and/or the source/drain region. Operation 720 performs a first rapid thermal process Operation 730 exposes the substrate to a first solution comprising dilute nitric acid. Operation 740 rinses the substrate. Operation 750 performs a second rapid thermal process. Operation 760 exposes the substrate to a second solution comprising nitric acid and hydrochloric acid. Operation 770 rinses the surface. Operation 780 exposes the substrate to a third solution comprising dissolved chlorine gas. Operation 790 rinses the surface.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for cleaning nickel and platinum residues from a surface of a substrate, comprising:
    exposing the surface to a sulfuric acid solution;
    performing a rapid thermal anneal process;

after exposing the surface to the sulfuric acid solution and performing the rapid thermal anneal, exposing the surface to a first solution containing a mixture of nitric acid and hydrochloric acid; and exposing the surface to a second solution containing dissolved chlorine gas; and after performing the rapid thermal anneal process and before exposing the surface to the first solution, exposing the substrate to a third solution comprising nitric acid and performing a second rapid thermal process.

2. A method as in claim 1, further comprising bubbling chlorine gas through a fluid to form the second solution.

3. A method as in claim 2, wherein the fluid comprises water, acid or an organic solvent.

4. A method as in claim 1, wherein the chlorine gas is generated from $Ca(OCl)_2$ reacting with HCl, from $MnO_2$ reacting with HCl, or from NaOCl reacting with $NH_3$.

5. A method for forming a nickel platinum silicide, the method comprising:

providing a substrate, the substrate comprising at least one silicon region;

forming a layer comprising nickel and platinum on the substrate;

performing a first thermal process to form nickel platinum silicide;

cleaning an un-reactive part of nickel platinum by exposing the substrate to first solution, the first solution comprising a mixture of nitric acid and hydrochloric acid;

cleaning platinum residues using a second solution containing dissolved chlorine gas; and after performing the first thermal process and before exposing the substrate to the first solution, exposing the substrate to a third solution comprising nitric acid and performing a second rapid thermal process.

6. A method as in claim 5, further comprising bubbling chlorine gas through a fluid to form the second solution.

7. A method as in claim 6, wherein the fluid comprises water, acid or an organic solvent.

8. A method for forming a semiconductor device, the method comprising:

forming a transistor including a gate electrode and a source/drain diffused layer over a semiconductor substrate;

forming a nickel platinum layer over the semiconductor substrate, covering the gate electrode and the source/drain diffused layer;

performing a first rapid thermal process;

exposing the semiconductor substrate to a first solution comprising nitric acid;

performing a second rapid thermal process;

exposing the substrate to a second solution comprising a mixture of nitric acid and hydrochloric acid; and exposing the substrate to a third solution containing dissolved chlorine gas.

9. A method as in claim 8, further comprising bubbling chlorine gas through a fluid to form the second solution.

10. A method as in claim 9, wherein the fluid comprises water, acid or an organic solvent.

11. A method as in claim 8 wherein the temperature of the third solution is between about 40 and about 60 C.

12. A method as in claim 8, wherein the chlorine gas is generated from $Ca(OCl)_2$ reacting with HCl, from $MnO_2$ reacting with HCl, or from NaOCl reacting with $NH_3$.

13. A method as in claim 8 wherein the first rapid thermal process is performed at temperature less than about 380 C.

14. A method as in claim 8 wherein the concentration of the nitric acid in the first solution is less than about 10 wt %.

15. A method as in claim 8 wherein the second rapid thermal process is performed at temperature greater than about 300 C.

16. A method as in claim 8 wherein the concentration of the nitric acid in the second solution is less than about 10 wt %.

17. A method as in claim 8 wherein the concentration of the hydrochloric acid in the second solution is less than about 20 wt %.

\* \* \* \* \*